(12) United States Patent
Lin

(10) Patent No.: US 9,091,526 B2
(45) Date of Patent: Jul. 28, 2015

(54) EQUIPMENT OF INSPECTING THICKNESS OF FIBRE CLOTH AND METHOD THEREFOR

(71) Applicant: TAIWAN POWER TESTING TECHNOLOGY CO., LTD., New Taipei (TW)

(72) Inventor: Yu-Chiang Lin, New Taipei (TW)

(73) Assignee: TAIWAN POWER TESTING TECHNOLOGY CO., LTD., New Taipei (TW)

( * ) Notice: Subject to any disclaimer, the term of this patent is extended or adjusted under 35 U.S.C. 154(b) by 198 days.

(21) Appl. No.: 13/712,036

(22) Filed: Dec. 12, 2012

(65) Prior Publication Data

US 2014/0125331 A1 May 8, 2014

(30) Foreign Application Priority Data

Nov. 8, 2012 (TW) .............................. 101141575 A

(51) Int. Cl.
*G01B 7/06* (2006.01)
*H01L 21/66* (2006.01)

(52) U.S. Cl.
CPC ........ *G01B 7/10* (2013.01); *G01B 7/105* (2013.01); *H01L 22/12* (2013.01)

(58) Field of Classification Search
CPC ............ G01B 7/105; G01B 7/10; G01B 7/06; G01B 21/08; G01B 2210/46; G01B 7/107; G01B 2210/44; G01R 27/00; G01R 33/1223; G01R 33/0356; G01R 33/091; G01R 33/12; G01R 33/14; H01L 22/12; H01L 22/26; G01D 5/202
USPC .......................... 324/250, 356, 374, 229–231
See application file for complete search history.

(56) References Cited

U.S. PATENT DOCUMENTS

| | | | | |
|---|---|---|---|---|
| 5,075,622 A * | 12/1991 | Konii et al. | .................... | 324/229 |
| 5,525,903 A * | 6/1996 | Mandl et al. | .................. | 324/230 |
| 5,781,008 A * | 7/1998 | Muller et al. | ................. | 324/230 |
| 5,805,291 A * | 9/1998 | Calvin et al. | .................. | 356/429 |
| 6,040,694 A * | 3/2000 | Becker | .......................... | 324/230 |
| 6,563,308 B2 * | 5/2003 | Nagano et al. | ................. | 324/230 |
| 6,573,712 B2 * | 6/2003 | Arai | ............................... | 324/238 |
| 8,327,901 B2 * | 12/2012 | Barra et al. | .................... | 156/425 |
| 2010/0207620 A1 * | 8/2010 | Gies | .............................. | 324/240 |
| 2011/0260720 A1 * | 10/2011 | Fischer | ......................... | 324/229 |

* cited by examiner

*Primary Examiner* — Bot Ledynh
*Assistant Examiner* — Dustin Dickinson
(74) *Attorney, Agent, or Firm* — Muncy, Geissler, Olds & Lowe, P.C.

(57) ABSTRACT

An equipment for inspecting the thickness of fiber cloth and a method therefor. The method includes disposing a fiber cloth on a metal backboard; sensing an eddy current responding from the fiber cloth and the metal backboard by an eddy current sensing device to obtain a multilayer thickness value; and comparing the multilayer thickness value with a single-layer thickness value to obtain a cloth thickness value corresponding to the thickness of the fiber cloth, wherein the single-layer thickness value is obtained by sensing an eddy current responding from the metal backboard, thereby the thickness of fiber cloth can be obtained.

10 Claims, 4 Drawing Sheets

EQUIPMENT OF INSPECTING THICKNESS OF FIBRE CLOTH AND METHOD THEREFOR

FIELD OF THE INVENTION

The present invention relates to a fibre cloth inspecting method and equipment, and more particularly to an equipment of inspecting thickness of fibre cloth and method therefor.

BACKGROUND OF THE INVENTION

Fibre cloth is widely used in modern life. The fibre cloth is applied to various objects, such as clothes, a cover of equipment shell, and architectural materials. And the quality of these objects is relative to the property of the fibre cloth. In view of this, the inspection of fibre cloth is therefor so important in order to choose the fibre cloth with good quality.

Traditional fibre cloth inspecting method includes tensile strength testing, tensile rigidity testing, tensile elastic testing, flexural strength testing, and deformation testing, etc. Since these traditional methods could not be processed without destroying the material of fibre cloth itself, it thus leads to the fact that it only allows a portion of fibre cloth to be tested rather than the whole fibre cloth to be test, and that portion of fibre cloth should not be a portion of fibre cloth that is to be processed in the following procedures. Moreover, the result of these traditional methods can only be taken as a reference report while producing real product of fibre cloth.

In the process that fibre is manufactured to become fibre cloth, the process will affect the thickness and the degree of uniformity of fibre cloth. The thickness of fibre cloth is an important property in relation to the quality of products having the fibre cloth. For example, it enhances a touch feel of a device if the fibre cloth with uniform thickness is used to cover on the device.

SUMMARY OF THE INVENTION

The thickness of fibre cloth is closed relating to the manufacturing process. The thickness of fibre cloth is an important characteristic property if the quality of the product having the fibre cloth is considered. It thus has to inspect the thickness of fibre cloth accurately for further evaluating the quality of manufactured products.

Accordingly, an aspect of the present invention is to provide an equipment of inspecting thickness of fibre cloth and method therefor for accurately inspecting the thickness of fibre cloth under which it solves the problems about evaluation shortage.

The method of inspecting thickness of fibre cloth comprises following steps: (a) disposing a fibre cloth on a metal backboard; (b) sensing an eddy current responding from the fibre cloth disposed on the metal backboard by enabling an eddy current sensor of an eddy current sensing device to directly be in contact with a upper surface of the fibre cloth so as to allow the eddy current sensing device to obtain a multilayer thickness value; and (c) comparing the multilayer thickness value with a single-layer thickness value to obtain a cloth thickness value corresponding to the thickness of the fibre cloth, wherein the single-layer thickness value is obtained by enabling the eddy current sensor of the eddy current sensing device to directly be in contact with a upper surface of the metal backboard so as to allow the eddy current sensing device to sense an eddy current responding from the metal backboard.

According to an embodiment of the present invention, in the step (a), the fibre cloth is a fibre cloth that is being gummed.

According to an embodiment of the present invention, the step (b) includes a step of moving a sensing position of the fibre cloth.

According to an embodiment of the present invention, the fibre cloth is a carbon fibre cloth.

The equipment of inspecting thickness of fibre cloth comprises a metal backboard, an eddy current sensing device, and a computing controlling device. The metal backboard is provided for disposing a fibre cloth thereon. The eddy current sensing device includes an eddy current sensor for contacting an upper surface of the fibre cloth to sense an eddy current responding from the fibre cloth disposed on the metal backboard so as to allow the eddy current sensing device to obtain a multilayer thickness value. The computing controlling device electrically connects with the eddy current sensing device to control the magnetic field applied by the eddy current sensor and to compute a sensing magnetic field sensed by the eddy current sensor, wherein the multilayer thickness value and a single-layer thickness value are compared to obtain a cloth thickness value corresponding to the thickness of the fibre cloth, the single-layer thickness value being obtained by enabling the eddy current sensor of the eddy current sensing device to contact a upper surface of the metal backboard so as to allow the eddy current sensing device to sense an eddy current responding from the metal backboard.

According to an embodiment of the present invention, the metal backboard and the fibre cloth are closely attached with each other.

According to an embodiment of the present invention, it further comprises a moving means connecting with the eddy current sensor to move the eddy current sensor relatively to the fibre cloth.

According to an embodiment of the present invention, it further comprises a pulling means connecting with the fibre cloth for pulling the fibre cloth to move relatively to the eddy current sensor.

According to an embodiment of the present invention, the fibre cloth is a carbon fibre cloth.

According to an embodiment of the present invention, it further comprises a moving mounting means for disposing the metal backboard thereon to move the fibre cloth relatively to the eddy current sensor.

By means of technical means of the present invention, the thickness of fibre cloth can be obtained by comparing the thickness value of the metal backboard and the fibre cloth with the thickness value of the metal backboard. Thereby, the thickness of fibre cloth can be inspected in a nondestructive manner. And the accuracy of the fibre cloth inspection is increasing so that the manufacturing yield of the fibre cloth can be further raised. The method provided in the present invention is easy to be performed and nondestructive so that it is very suitable for being applied to inspect the fibre cloth.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The present invention provides an equipment of inspecting thickness of fibre cloth and a method therefor. The embodiments of the equipment of inspecting thickness of fibre cloth and the method therefor are described as follows.

The First Embodiment

Figure 1:
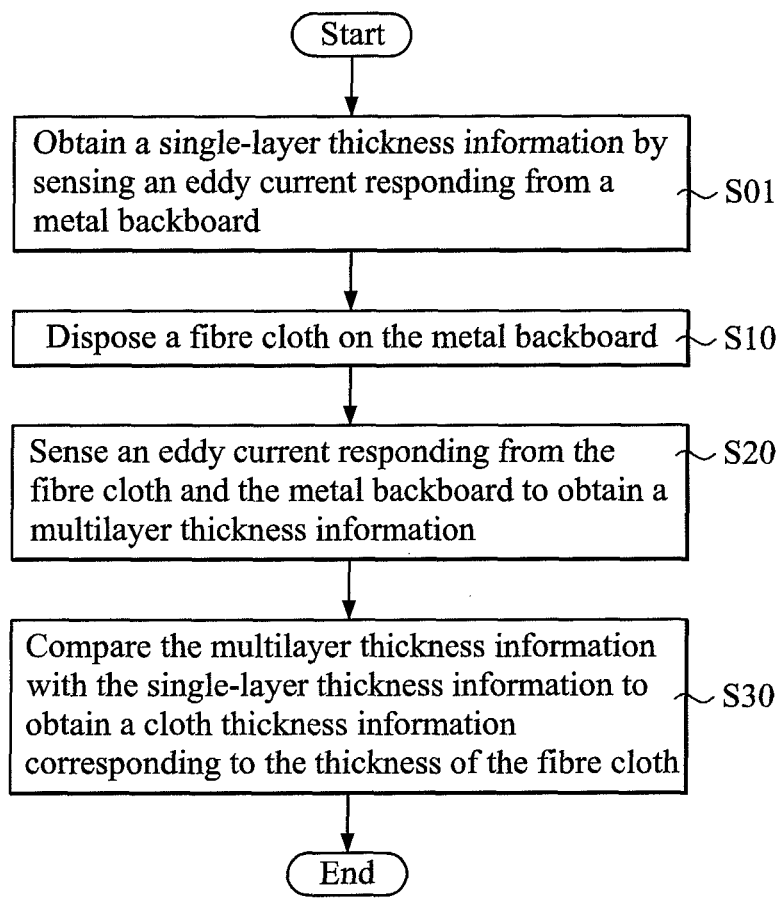
FIG. 1 is a flowchart illustrating the method of inspecting thickness of fibre cloth of the first embodiment according to the present invention.

Refer to FIG. 1. FIG. 1 is a flowchart illustrating the method of inspecting thickness of fibre cloth of the first embodiment according to the present invention. The method of inspecting thickness of fibre cloth includes following steps: disposing a fibre cloth on a metal backboard (Step S10); sensing an eddy current responding from the fibre cloth and the metal backboard by an eddy current sensing device to obtain a multilayer thickness value (Step S20); and comparing the multilayer thickness value with a single-layer thickness value to obtain a cloth thickness value corresponding to the thickness of the fibre cloth, wherein the single-layer thickness value is obtained by sensing an eddy current responding from the metal backboard (Step S30).

Figure 2:
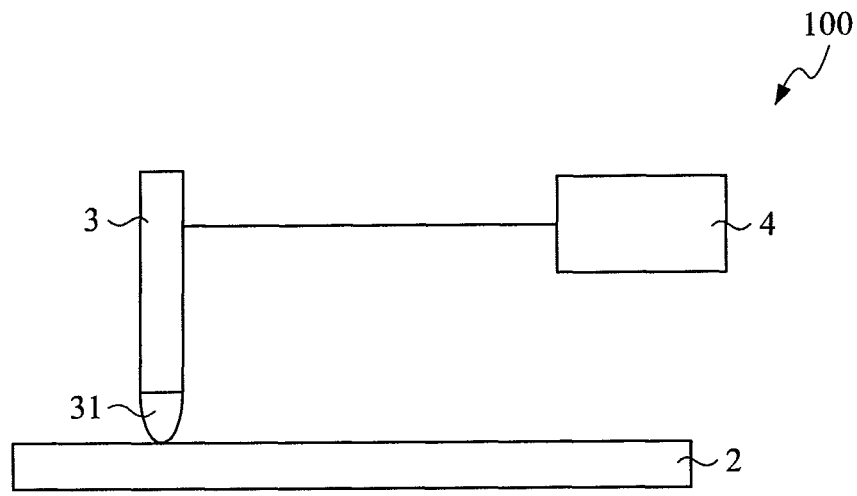
FIG. 2 is a schematic diagram illustrating inspecting the metal backboard of the first embodiment according to the present invention.
Figure 3:
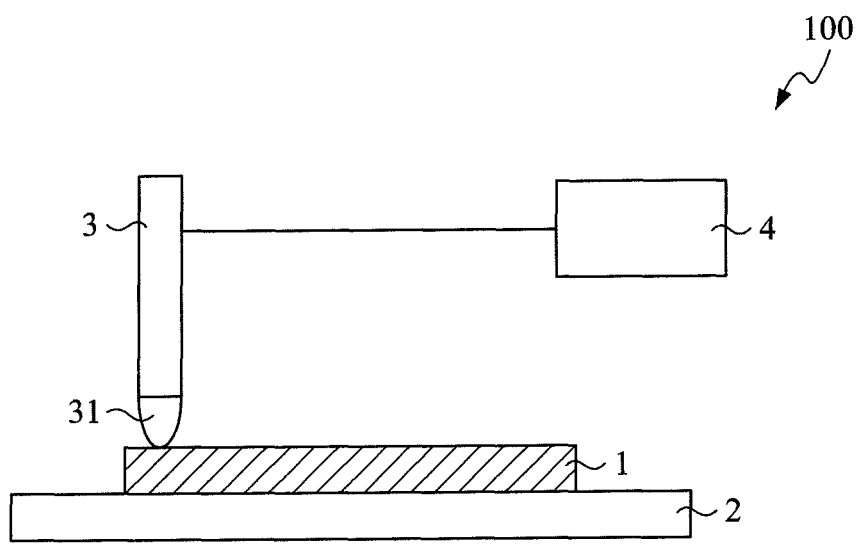
FIG. 3 is a schematic diagram illustrating inspecting the fibre cloth and the metal backboard of the first embodiment according to the present invention.

Refer to FIG. 2 and FIG. 3 and also refer to FIG. 1. The first embodiment is described as follows.

In this embodiment, the method of inspecting thickness of fibre cloth is performed by a thickness inspecting equipment 100 for fibre cloth. The thickness inspecting equipment 100 includes a metal backboard 2, an eddy current sensing device 3, and a computing controlling device 4. The metal backboard 2 is provided for disposing a fibre cloth 1 thereon. The eddy current sensing device 3 includes an eddy current sensor 31. The eddy current sensor 31 senses and passes the upper surface of the fibre cloth 1. The computing controlling device 4 electrically connects with the eddy current sensing device 3 to control the magnetic field applied by the eddy current sensor 31 and to compute a sensing magnetic field sensed by the eddy current sensor 31.

First, as show in FIG. 2, by using the eddy current sensing device 3, a single-layer thickness value is obtained by sensing an eddy current responding from the metal backboard 2 (Step S01). Specifically, the eddy current sensor 31 of the eddy current sensing device 3 senses and passes the metal backboard 2, and the computing controlling device 4 generates a single-layer thickness value according to the type of the metal backboard 2 by comparing the magnetic field applied by the eddy current sensor 31 and the magnetic field sensed by the eddy current sensor 31. The single-layer thickness value is the value representing the thickness of the metal backboard 2. The thickness of the metal backboard 2 may be obtained in other manner in advance, so the Step S01 may be not necessary.

Thereafter, disposing the fibre cloth 1 on the metal backboard 2 (Step S10). In this embodiment, the fibre cloth 1 is a carbon fibre cloth. In order to make the fibre cloth 1 hard so that not easy to be deformed, the fibre cloth 1 is a fibre cloth that is being gummed. The metal backboard 2 is made of copper. The metal backboard 2 also can be made of other electrically conductive materials such as gold, silver, iron, aluminum, and zinc.

Then, as shown in FIG. 3, by using the eddy current sensing device 3, sensing an eddy current responding from the fibre cloth 1 and the metal backboard 2 in an eddy current sensing manner to obtain a multilayer thickness value responding from the fibre cloth 1 and metal backboard 2 (Step S20). Similarly, the multilayer thickness value is a sensing value obtained, by having computing controlling device 4 to control the magnetic field applied by the eddy current sensor 31 and then to compute a sensing magnetic field sensed by the eddy current sensor 31. And the metal backboard 2 and the fibre cloth 1 are attached with each other to prevent from generating any gap space therebetween.

Further, the computing controlling device 4 compares the multilayer thickness value with the single-layer thickness value to obtain a cloth thickness value corresponding to the thickness of the fibre cloth 1 (Step S30). For example, the computing controlling device 4 obtains the thickness of the fibre cloth 1 by minus the single-layer thickness value obtained in Step S01 from the multilayer thickness value obtained in Step S20. Of course, the present invention is not limited to that, the computing controlling device 4 also can compare the multilayer thickness value with the single-layer thickness value to obtain a cloth thickness value corresponding to the thickness of the fibre cloth 1 by using other algorithms. Furthermore, the computing controlling device 4 can compare various positions on the fibre cloth 1 regarding thickness to obtain a deformation value of the fibre cloth 1.

Figure 4:
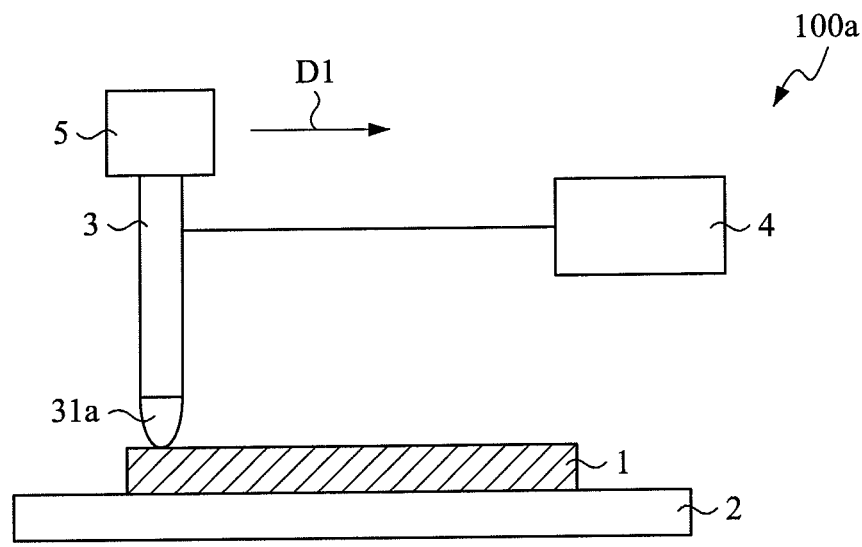
FIG. 4 is a schematic diagram illustrating the thickness inspecting equipment performing the method of inspecting thickness of fibre cloth of the second embodiment according to the present invention.

Refer to FIG. 4. FIG. 4 is a schematic diagram illustrating the thickness inspecting equipment performing the method of inspecting thickness of fibre cloth of the second embodiment according to the present invention. The second embodiment is different from the first embodiment in follows. In order to realize the thickness of entire fibre cloth in view of inspecting the degree of uniformity of fibre cloth, in this embodiment, the thickness inspecting equipment 100a further includes a moving means 5 connecting with an eddy current sensor 31a to move the eddy current sensor 31a relatively to the fibre cloth 1. The moving means 5 is a rolling wheel member, a towing machine, or the like, that moves along a length direction D1 of the fibre cloth 1 to enable the eddy current sensor 31a sensing all length of the fibre cloth 1. In this embodiment, the step S20 includes a step of moving a sensing position of the fibre cloth.

Figure 5:
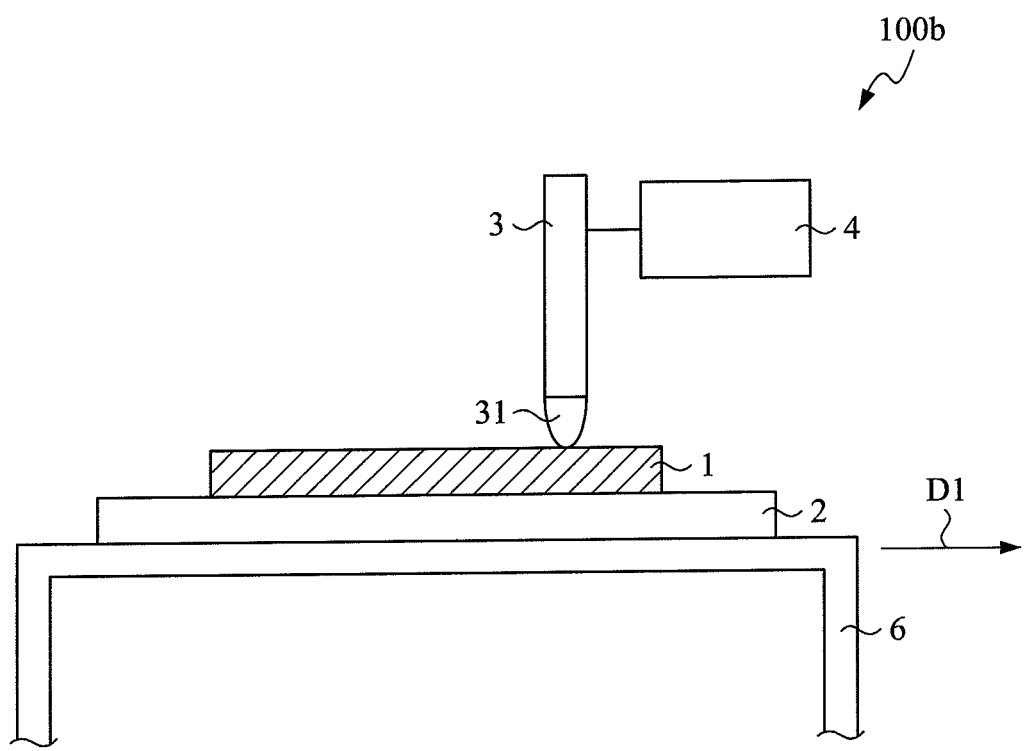
FIG. 5 is a schematic diagram illustrating the thickness inspecting equipment performing the method of inspecting thickness of fibre cloth of the third embodiment according to the present invention.

Refer to FIG. 5. FIG. 5 is a schematic diagram illustrating the thickness inspecting equipment performing the method of inspecting thickness of fibre cloth of the third embodiment according to the present invention. The third embodiment is different from the first embodiment in follows. In order to realize the thickness of entire fibre cloth in view of inspecting the degree of uniformity fibre cloth, in this embodiment, the thickness inspecting equipment 100b further includes a moving mounting means 6 for disposing the metal backboard 2 thereon. The moving mounting means 6 can move along the length direction D1 of the fibre cloth 1 to make the backboard 2 and the fibre cloth 1 move relatively to the eddy current sensor 31 so as to enable the eddy current sensor 31 sensing all length of the fibre cloth 1. In this embodiment, the step S20 includes a step of moving a sensing position of the fibre cloth.

Figure 6:
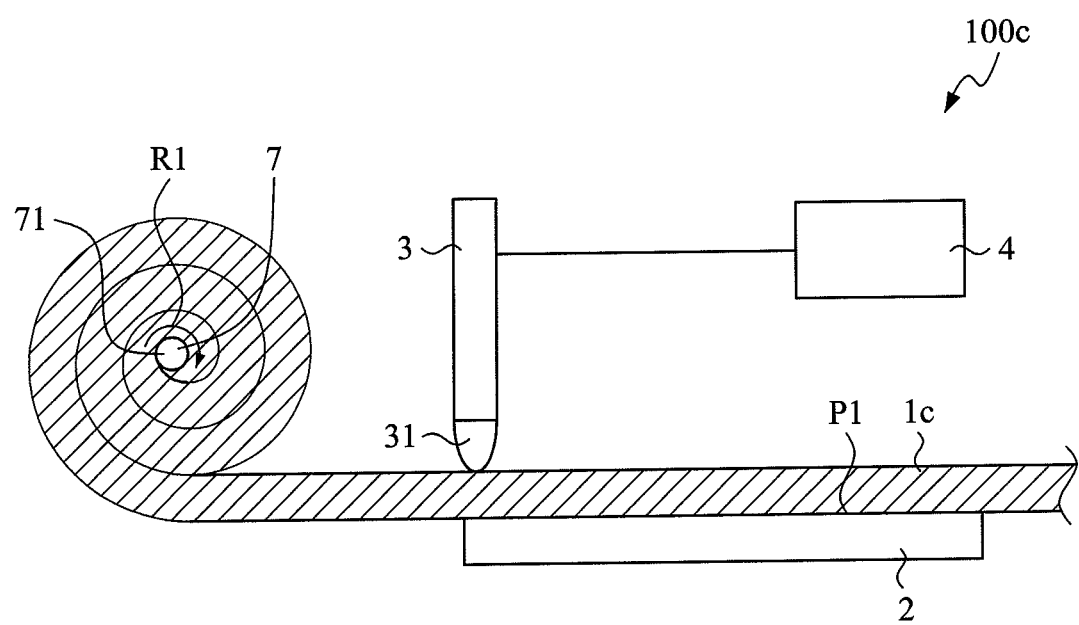
FIG. 6 is a schematic diagram illustrating the thickness inspecting equipment performing the method of inspecting thickness of fibre cloth of the fourth embodiment according to the present invention.

Refer to FIG. 6. FIG. 6 is a schematic diagram illustrating the thickness inspecting equipment performing the method of inspecting thickness of fibre cloth of the fourth embodiment according to the present invention. The fourth embodiment is different from the first embodiment in follows. In this embodiment, the length of the fibre cloth 1c is longer than that of the backboard 2. In order to inspect all length of the fibre cloth 1c regarding thickness, the thickness inspecting equipment 100c further includes a pulling means 7 connecting with the fibre cloth 1c for pulling the fibre cloth 1c along a guiding path P1 (i.e. the direction contrary to the length direction D1 in FIG. 4) to move the fibre cloth 1c in relation to the eddy current sensor 31. In this embodiment, the pulling means 7 has a scroll 71 that rotates in a rotation direction R1 to pull the fibre cloth 1c and to scroll one end of the fibre cloth 1c. By means of the pulling means 7, the fibre cloth 1c and the eddy current sensor 31 move relatively to each other, so that the position of the eddy current sensor 31 can be fixed and that the eddy current sensor 31 does not have to be the same as the eddy current sensor 31a as shown in the second embodiment that moves along the length direction of the fibre cloth.

In this embodiment, the Step S20 includes a step of moving a sensing position of the fibre cloth. A positional mapping relation between the fibre cloth 1c and the eddy current sensor 31 is determined according to the position of the fibre cloth 1c on the guiding path P1, and the position of the fibre cloth 1c on the guiding path P1 is determined according to a pulling speed of the pulling means 7 (i.e. the value that the angular velocity of the scroll 71 multiplies the radius of the scroll 71 in this embodiment).

The above description should be considered as only the discussion of the preferred embodiments of the present invention. However, a person skilled in the art may make various modifications to the present invention. Those modifications still fall within the spirit and scope defined by the appended claims.

What is claimed is:

1. A method of inspecting thickness of fibre cloth, comprising steps of:
   (a) disposing a fibre cloth on a metal backboard;
   (b) sensing an eddy current responding from the fibre cloth disposed on the metal backboard by enabling an eddy current sensor of an eddy current sensing device to directly be in contact with a upper surface of the fibre cloth so as to allow the eddy current sensing device to obtain a multilayer thickness value; and
   (c) comparing the multilayer thickness value with a single-layer thickness value to obtain a cloth thickness value corresponding to the thickness of the fibre cloth, wherein the single-layer thickness value is obtained by enabling the eddy current sensor of the eddy current sensing device to directly be in contact with an upper surface of the metal backboard so as to allow the eddy current sensing device to sense an eddy current responding from the metal backboard.

2. The method of inspecting thickness of fibre cloth as claimed in claim 1, wherein in the step (a), the fibre cloth is a fibre cloth that is being gummed.

3. The method of inspecting thickness of fibre cloth as claimed in claim 1, wherein the step (b) includes a step of moving a sensing position of the fibre cloth.

4. The method of inspecting thickness of fibre cloth as claimed in claim 1, wherein the fibre cloth is a carbon fibre cloth.

5. An equipment of inspecting thickness of fibre cloth, comprising:
   a metal backboard, provided for disposing a fibre cloth thereon;
   an eddy current sensing device, including an eddy current sensor for contacting an upper surface of the fibre cloth to sense an eddy current responding from the fibre cloth disposed on the metal backboard so as to allow the eddy current sensing device to obtain a multilayer thickness value; and
   a computing controlling device for electrically connecting with the eddy current sensing device to control the magnetic field applied by the eddy current sensor and to compute a sensing magnetic field sensed by the eddy current sensor, wherein the multilayer thickness value and a single-layer thickness value are compared to obtain a cloth thickness value corresponding to the thickness of the fibre cloth, the single-layer thickness value being obtained by enabling the eddy current sensor of the eddy current sensing device to contact a upper surface of the metal backboard so as to allow the eddy current sensing device to sense an eddy current responding from the metal backboard.

6. The equipment of inspecting thickness of fibre cloth as claimed in claim 5, wherein the metal backboard and the fibre cloth are closely attached with each other.

7. The equipment of inspecting thickness of fibre cloth as claimed in claim 5, further comprising a moving means connecting with the eddy current sensor to move the eddy current sensor relatively to the fiber cloth.

8. The equipment of inspecting thickness of fibre cloth as claimed in claim 5, further comprising a pulling means connecting with the fibre cloth for pulling the fibre cloth to move relatively to the eddy current sensor.

9. The equipment of inspecting thickness of fibre cloth as claimed in claim 5, wherein the fibre cloth is a carbon fibre cloth.

10. The equipment of inspecting thickness of fibre cloth as claimed in claim 5, further comprising a moving mounting means for disposing the metal backboard thereon to move the fibre cloth relatively to the eddy current sensor.

* * * * *